(12) United States Patent
Goldbach

(10) Patent No.: US 7,378,321 B2
(45) Date of Patent: May 27, 2008

(54) METHOD FOR PATTERNING A SEMICONDUCTOR COMPONENT

(75) Inventor: Matthias Goldbach, Dresden (DE)

(73) Assignee: Infineon Technologies AG, Munich (DE)

( * ) Notice: Subject to any disclaimer, the term of this patent is extended or adjusted under 35 U.S.C. 154(b) by 107 days.

(21) Appl. No.: 11/392,523

(22) Filed: Mar. 29, 2006

(65) Prior Publication Data

US 2006/0258130 A1 Nov. 16, 2006

(30) Foreign Application Priority Data

May 12, 2005 (DE) .................... 10 2005 022 084

(51) Int. Cl.
*H01L 21/336* (2006.01)
(52) U.S. Cl. .................. 438/286; 438/302; 438/303; 257/E21.618
(58) Field of Classification Search ........ 438/242–249, 438/386–392, 286–291; 257/E21.618
See application file for complete search history.

(56) References Cited

U.S. PATENT DOCUMENTS

| | | | |
|---|---|---|---|
| 5,670,395 A | 9/1997 | Pan | |
| 5,770,492 A | 6/1998 | Kapoor | |
| 6,169,003 B1* | 1/2001 | Hu et al. | 438/299 |
| 6,271,106 B1* | 8/2001 | Grivna et al. | 438/570 |
| 6,797,597 B2 | 9/2004 | Ferreira et al. | |
| 2005/0001267 A1* | 1/2005 | Miyagawa et al. | 257/332 |
| 2005/0170659 A1* | 8/2005 | Hanafi et al. | 438/723 |

FOREIGN PATENT DOCUMENTS

KR 19603794 1/1997

\* cited by examiner

*Primary Examiner*—H. Jey Tsai
(74) *Attorney, Agent, or Firm*—Jenkins, Wilson, Taylor & Hunt, P.A.

(57) ABSTRACT

In a method for patterning a semiconductor component a first cover layer is applied to a first region and a second region of a semiconductor component being arranged in a semiconductor substrate. The first region is different from the second region. The first cover layer is patterned using a photolithographic mask so that the first region is uncovered and the second region remains covered by the first cover layer. The first region is uncovered, a second cover layer is applied to the uncovered first region, and the first cover layer is removed so that the second region is uncovered. The uncovered second region is then doped.

10 Claims, 10 Drawing Sheets

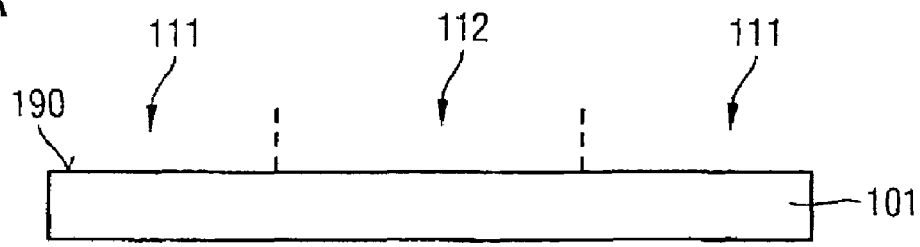
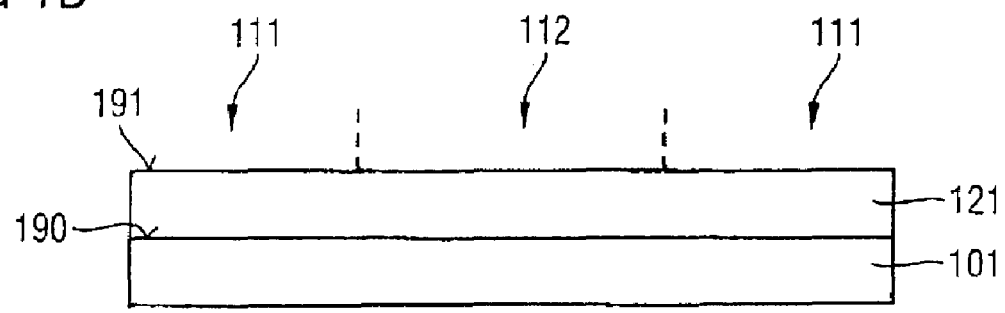
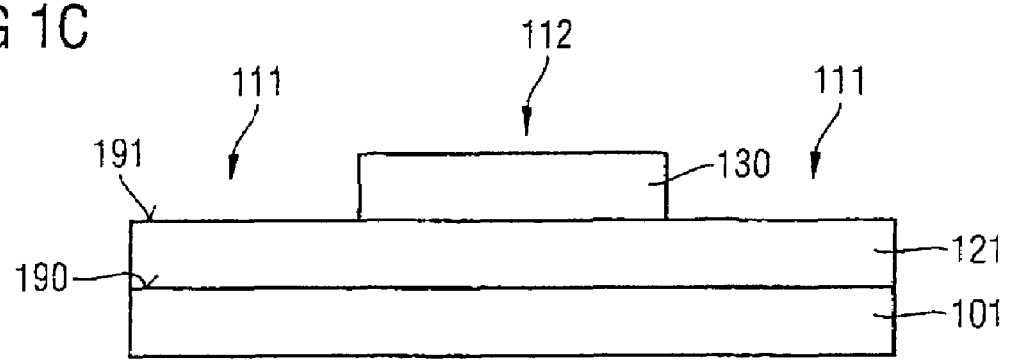
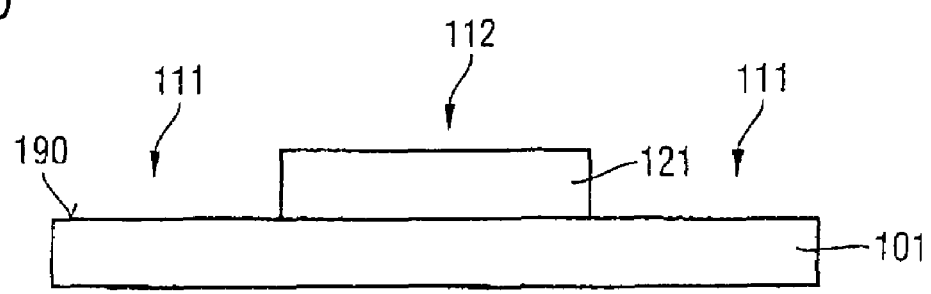

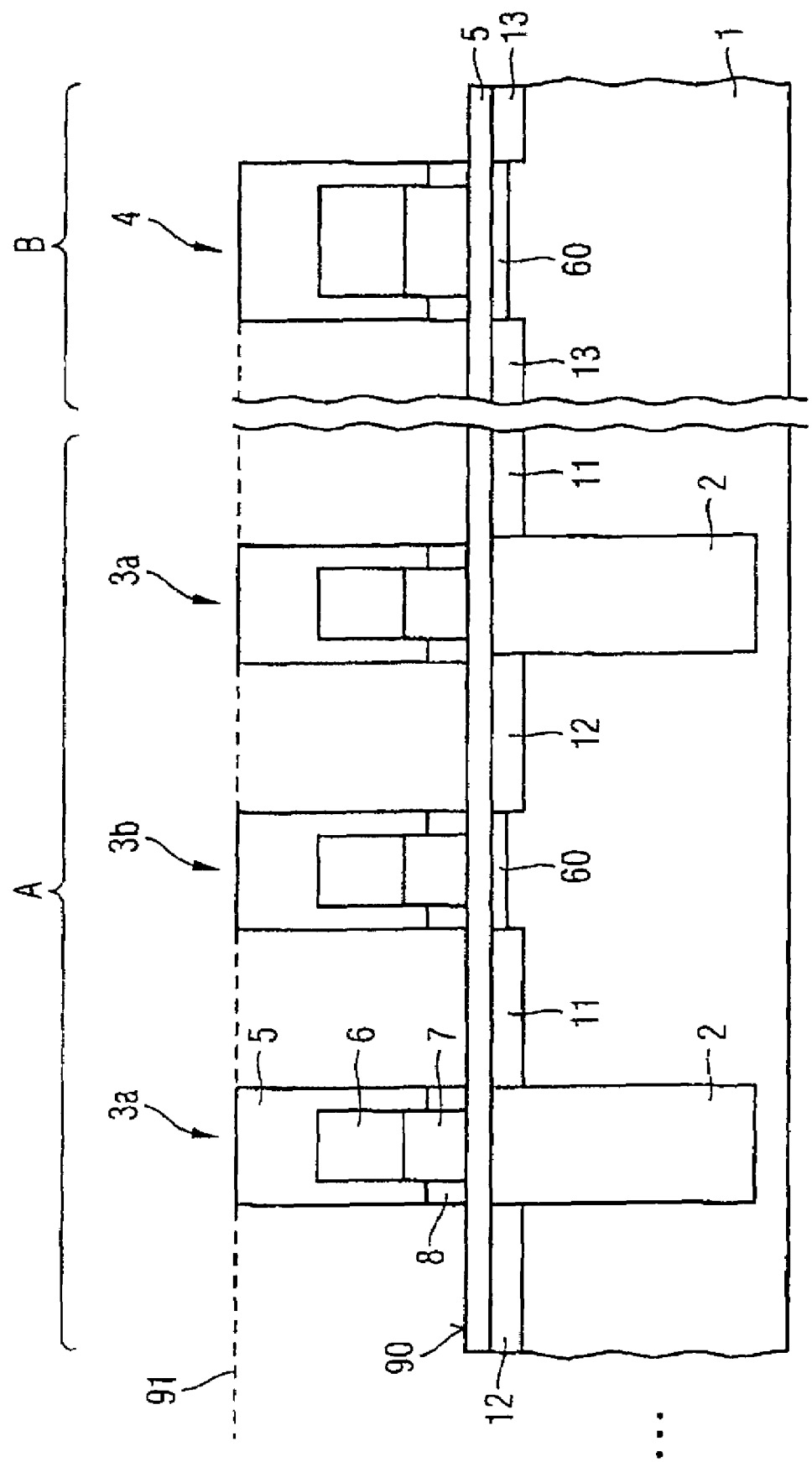

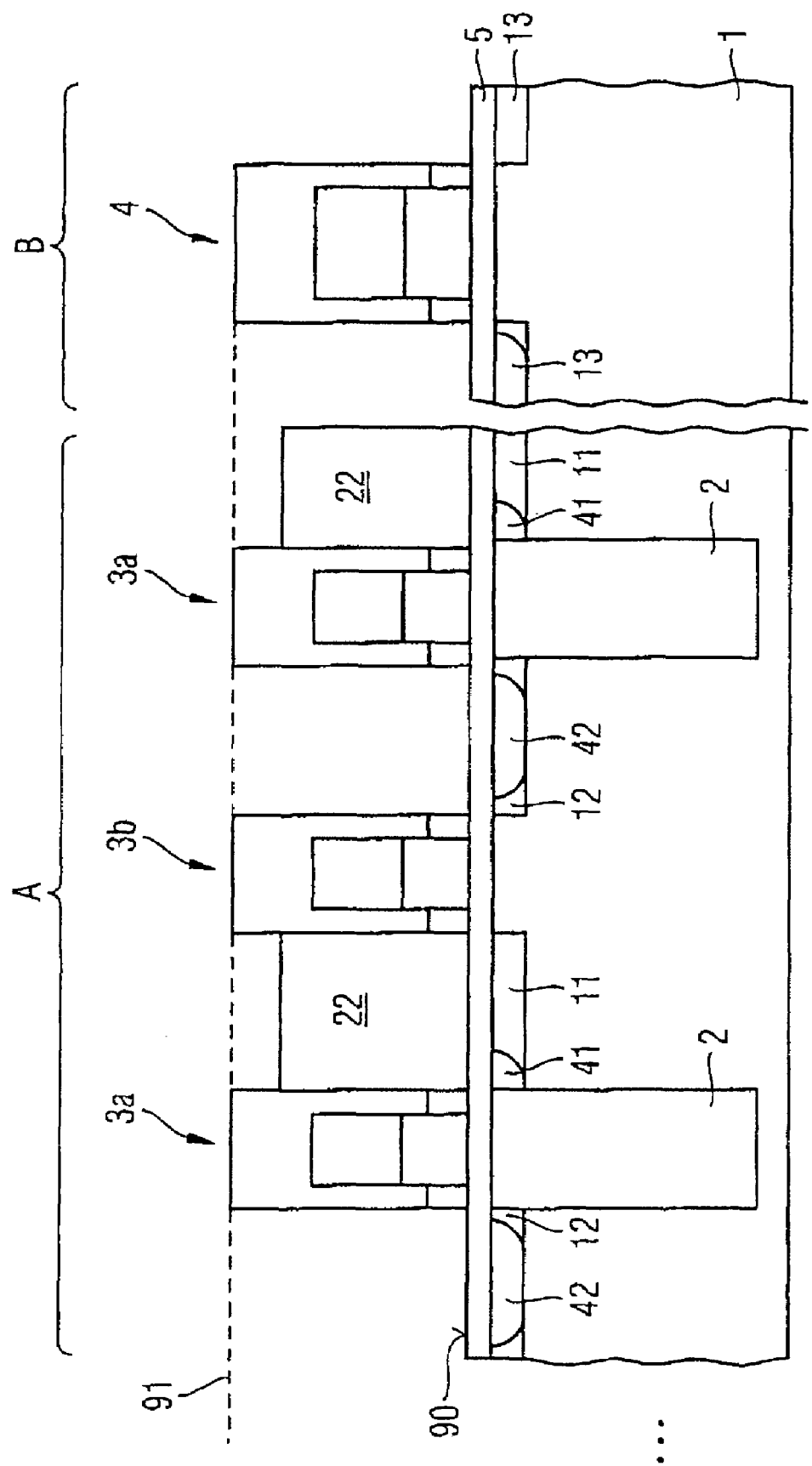

METHOD FOR PATTERNING A SEMICONDUCTOR COMPONENT

BACKGROUND OF THE INVENTION

1. Field of the Invention

The present invention relates to a method for patterning a semiconductor component.

Although the present invention can be used in general terms for the patterning of a semiconductor component having first and second regions, the text which follows will describe the problems underlying the invention on the basis of the patterning of a memory cell of a DRAM memory.

2. Description of the Prior Art

In the text which follows, a generally known memory cell of a DRAM memory is described with reference to FIG. 3. The memory cell includes a storage capacitor 802 (capacitor), which is embedded in a semiconductor substrate 801, and a horizontal transistor.

The transistor has a channel region 860 in a horizontal surface of the semiconductor substrate 801. A node region 811 and a bit line region 812 are arranged opposite one another horizontally adjacent to the channel region 860. A gate stack 803 is provided vertically with respect to the channel region 860. When a suitable potential is applied to the gate stack 803, the bit line region 812 is conductively connected to the node region 811.

The capacitor 802 and the transistor are arranged in such a way that the capacitor is conductively connected to the node region 811. Therefore, when the transistor is switched to a conducting state, a current path results between the storage capacitor 802 and the bit line region 812. For the DRAM memory, the bit line region 812 is connected to a bit line. For operation of the DRAM memory, it is necessary for the bit line and therefore the current path to have a defined electrical resistance.

The production of the transistor and of the capacitor 802 is carried out in a plurality of production steps, using a plurality of photolithographic masks. Deviations in the positioning of the individual masks with respect to one another result in a variation in the distance between the capacitor 802 and the gate stack 803 of the transistor, i.e. the dimensions of the node region 811, resulting in an undesirable variation in the resistance of the above-described current path. Therefore, an additional doping 841, which compensates for the variation in the resistance, is introduced into the node region 811.

This additional doping should not affect the switching properties of the transistor. Therefore, this doping 841 is only implanted remote from the channel region 860, in a region of the node region 811 which adjoins the capacitor 841. This is achieved by implantation at an angle to the surface of the semiconductor substrate 801. In the bit line region 812, however, the doping 841 is implanted near to the channel region 860. On the other hand, different dopings have to be introduced into the bit line region 812, which need not be present in the first region 811. Consequently, generally known semiconductor production processes provide for the node region 811 first of all to be covered with a photolithographic mask and then for the doping in the bit line region 812 to be carried out. After the photo-lithographic mask has been removed, the node region 811 is covered with a second photolithographic mask, and then the bit line region 812 is doped.

For this purpose, the corresponding photolithographic masks have to be accurately patterned and positioned to within one third of the lateral feature size. For desired feature sizes of less than 50 nm, this requires accurate alignment to within 15 nm. Therefore, the corresponding photolithographic masks are also described as critical masks. This imposes very high demands on process steps and apparatuses used to apply the critical mask, involving inter alia the use of high-resolution primary masks, lithography in the ultraviolet spectral region, a correspondingly suitable photoresist, an accurate alignment of the primary mask and the semiconductor substrate 801 with respect to one another. A considerable depth of trenches between the gate stacks results in difficulties in the exposure of masks, on account of the limited focal depth of the pattern being exposed in the vertical direction.

SUMMARY OF THE INVENTION

It is an object of the present invention to provide an improved process, in particular a simpler photolithographic process, for producing the structure described in the introduction.

The object is achieved in accordance with the invention by means of a process for patterning a semiconductor component which is arranged in a semiconductor substrate and has at least one first region and at least one second region that is different than the first region is carried out using the following steps. In a first step, a first capping layer is applied at least to the first region and the second region. The first capping layer is patterned by means of a photolithographic mask, in such a manner that the first region is uncovered and the second region remains covered by the first capping layer. The uncovered first region is doped. A second capping layer is applied at least to the uncovered first region. The first capping layer is removed, in such a manner that the second region is uncovered. In a final step, the uncovered second region is doped.

In one aspect of the inventive process, the first capping layer using the single photolithographic mask is patterned. This first capping layer, in a subsequent step, serves not only as a mask for the doping but also to form a second, substantially complementary mask. As a result, there is no need for a second photolithographic mask for covering the first regions.

The step of removing the first capping layer may be carried out by a selective etch. In this context, the term selective is to be understood as meaning that substantially only the first capping layer is etched and the second capping layer is removed only to a considerably lesser extent.

In a restricted version of the inventive process, the photolithographic mask is removed at the earliest after the removal of the first capping layer from the first region and before the selective removal of the first capping layer from the second region.

In a further restricted version of the inventive process, after the step of applying the second capping layer, the second capping layer is planarized and caused to recede in such a manner that the first capping layer on the first region is uncovered. Under certain circumstances, the application of the second capping layer covers the first capping layer in the first regions. Therefore, it is preferable for the second capping layer to be thinned to a sufficient extent to uncover the first capping layer.

The first capping layer may include polysilicon and/or polysilicon-germanium and for the second capping layer to include silicon oxide, aluminum oxide and/or silicate glass.

The doping in the first and/or second regions may be effected by ion implantation.

The ion implantation for doping the first region may be carried out at a first implantation angle, and the ion implantation for doping the second region may be carried out at a second implantation angle with respect to a surface of the semiconductor substrate, with the first implantation angle and the second implantation angle being different.

A multiple ion implantation at different second implantation angles may be carried out for doping into the second region.

At least one vertical gate stack may be arranged on the semiconductor component, the first region and the second region being horizontally adjacent to two opposite sides of the vertical gate stack.

A spacer may be applied to the uncovered second region and to the second capping layer in the first region.

DESCRIPTION OF THE DRAWINGS

FIG. 1a-1h are part-sections through a semiconductor substrate used to explain a first exemplary embodiment of the inventive process.

FIG. 2a-2g are part-sections through a semiconductor substrate used to explain a second exemplary embodiment of the inventive process.

DESCRIPTION OF THE PREFERRED EMBODIMENTS

Figure 1E:
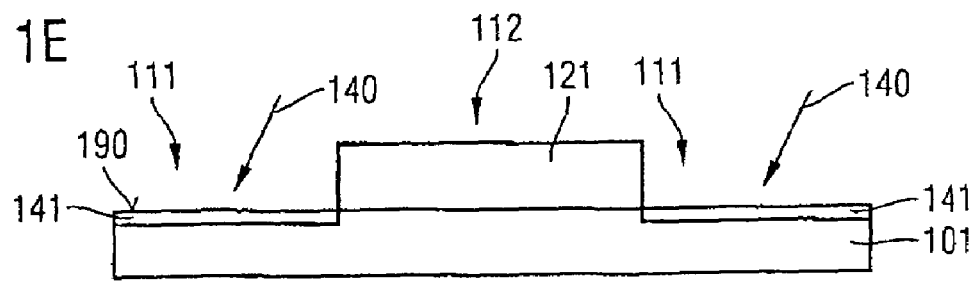

In the figures, identical reference designations denote identical or functionally equivalent components, unless stated otherwise.

FIG. 1a to 1h diagrammatically depict part-sections through a semiconductor component, in order to provide a detailed explanation of steps of one configuration of the present invention.

First of all, a semiconductor substrate 101 is provided (FIG. 1a), which has an active surface 190, referred to below as the first surface. The first surface 190 has first regions 111 and second regions 112. The frequency and arrangement of the first and second regions 111, 112 depends on the requirement for the patterning of the semiconductor component and is not restricted by the illustration presented in FIG. 1a. A first capping layer 121 is applied to the first surface 190. This first capping layer 121 covers all the first regions 111 and all the second regions 112 (FIG. 1b). The top surface 191 of the first capping layer 121 denotes the surface of the capping layer 121 which faces away from the semiconductor substrate 101.

In a further step, a photoresist or a hard mask is applied to the top surface 191. This photoresist or the hard mask is patterned in such a way as to produce a photolithographic mask 130 which covers only the second regions 112 and not the first regions 111 (FIG. 1c).

The first capping layer 121 is removed in the first regions 111 by etching processes. In addition, the photolithographic mask 130 can subsequently be removed (FIG. 1d). The lateral pattern of the mask 130 has been transferred to the first capping layer 121. Therefore, the second regions 112 of the first surfaces 190 of the semiconductor substrate 101 are covered.

Doping measures, such as for example the implantation of ions (represented by the arrows 140 in FIG. 1e) can now be applied selectively to the first regions 111. By way of example, it is possible for the first regions 111 to be doped with a first dopant and a first doping profile near to the first surface 190 of the semiconductor substrate 101 in order to provide a doped region 141. In addition to ion implantation, the doping can also be carried out by diffusion from the gas phase or by application of a thin film of dopant. Furthermore, it is possible for additional layers to be applied to the first surface 190 exclusively in the first region 111. There are no restrictions on the freedom of choice with regard to doping of the first regions 111 to produce a doped region 141.

Figure 1F:
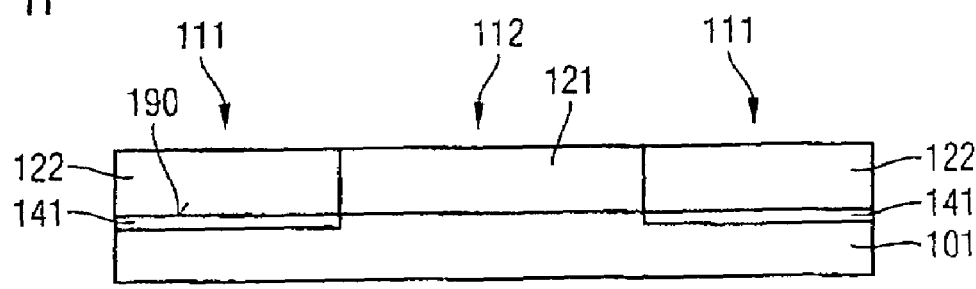

After the patterning, a second capping layer 122 is applied from one side of the first surface 190. This second capping layer 122 is planarized and/or thinned, so that the first capping layer 121 is uncovered again in the second region. The last step is not necessary if the possibility exists of applying the second capping layer 122 in such a way that it is not deposited on the surface of the first capping layer 121. This can be achieved, for example, by an ALD process (ALD=atomic layer deposition), the starting molecules of which do not adhere to the material of the first capping layer 121 but do adhere to the doped first surface 190 in the first region 111 (FIG. 1f).

Figure 1G:
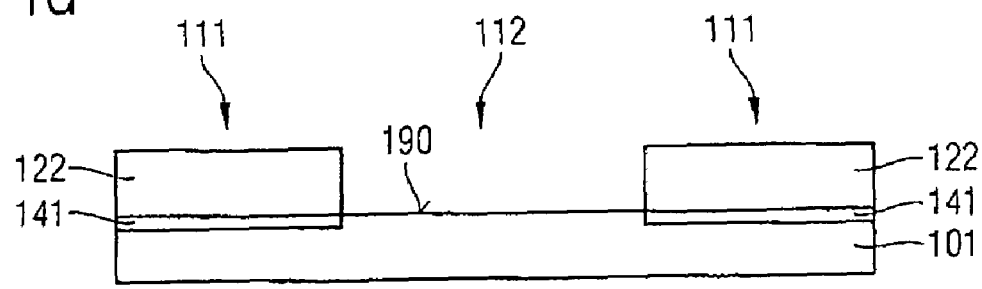

In a subsequent step, the first capping layer 121 is etched selectively. In this context, the term selectively means that primarily the first capping layer 121 is etched, whereas the second capping layer 122 is not. After this step, the second region 112 is uncovered and the first regions 111 are covered by the second capping layer 122 (FIG. 1g).

Figure 1H:
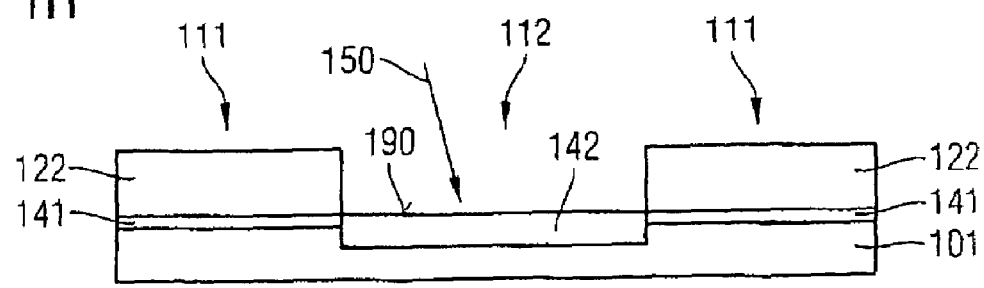

It is now possible to use second patterning steps, such as for example a further implantation step 150, to deliberately dope only the second region 112 of the first surface 190 of the semiconductor substrate 101, in order for example to form a second doping region 142 with a second dopant and a second doping profile (FIG. 1h). Generally, the first doped regions 141 and second doped regions will differ in terms of at least one property, for example the doping profile, the doping material, etc.

The configuration presented therefore makes it possible for the first and second regions 111, 112 to be doped independently of one another. All this requires is a single photolithographic mask 130 to be accurately aligned, and there are no misalignment tolerances. The main advantage of this configuration is that the aligning of the photolithographic mask 130 requires accurate alignment of the wafer with respect to the exposure device. In modern semiconductor structures, the first and second regions 112 are less than 200 nm wide. Accordingly, the lithographic mask 130 has to be aligned accurately to a fraction of the size of the first and second regions 111, 112, typically to within an accuracy of one third of the feature sizes. It will be apparent from this that the mechanical demands imposed on the holding of the wafers and the alignment of the wafers are very high. Moreover, it is possible to eliminate one exposure mask as well as the quantity of photoresist that has to be consumed.

One requirement imposed on the materials of the first capping layer 121 and the second capping layer 122 is that there must be a known selective etching operation which removes the first capping layer 121 but only removes the second capping layer 122 to a small extent, i.e. the etching operation is selective. Suitable materials for the first capping layer are polysilicon or polysilicon-germanium, and suitable materials for the second capping layer are silicate glass, silicon oxide or aluminum oxide. The use of these materials is generally known. Therefore, the first and second capping layers can be applied in known production steps and patterned as described above. It is therefore readily possible for the process according to the invention to be incorporated into the conventional processing of semiconductor components.

The third region can be covered by a protective mask before the steps described above are carried out.

Figure 2B:
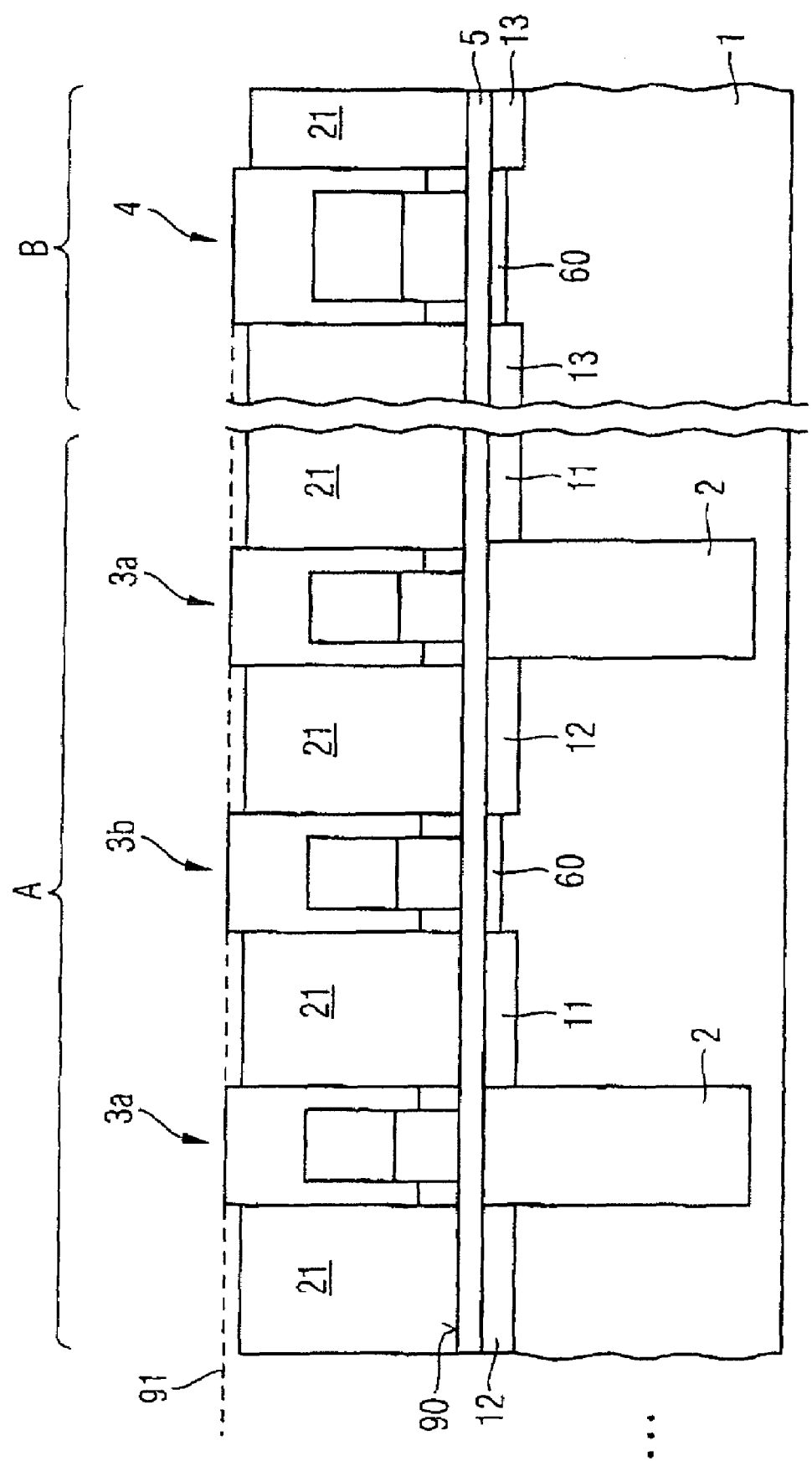
Figure 2C:
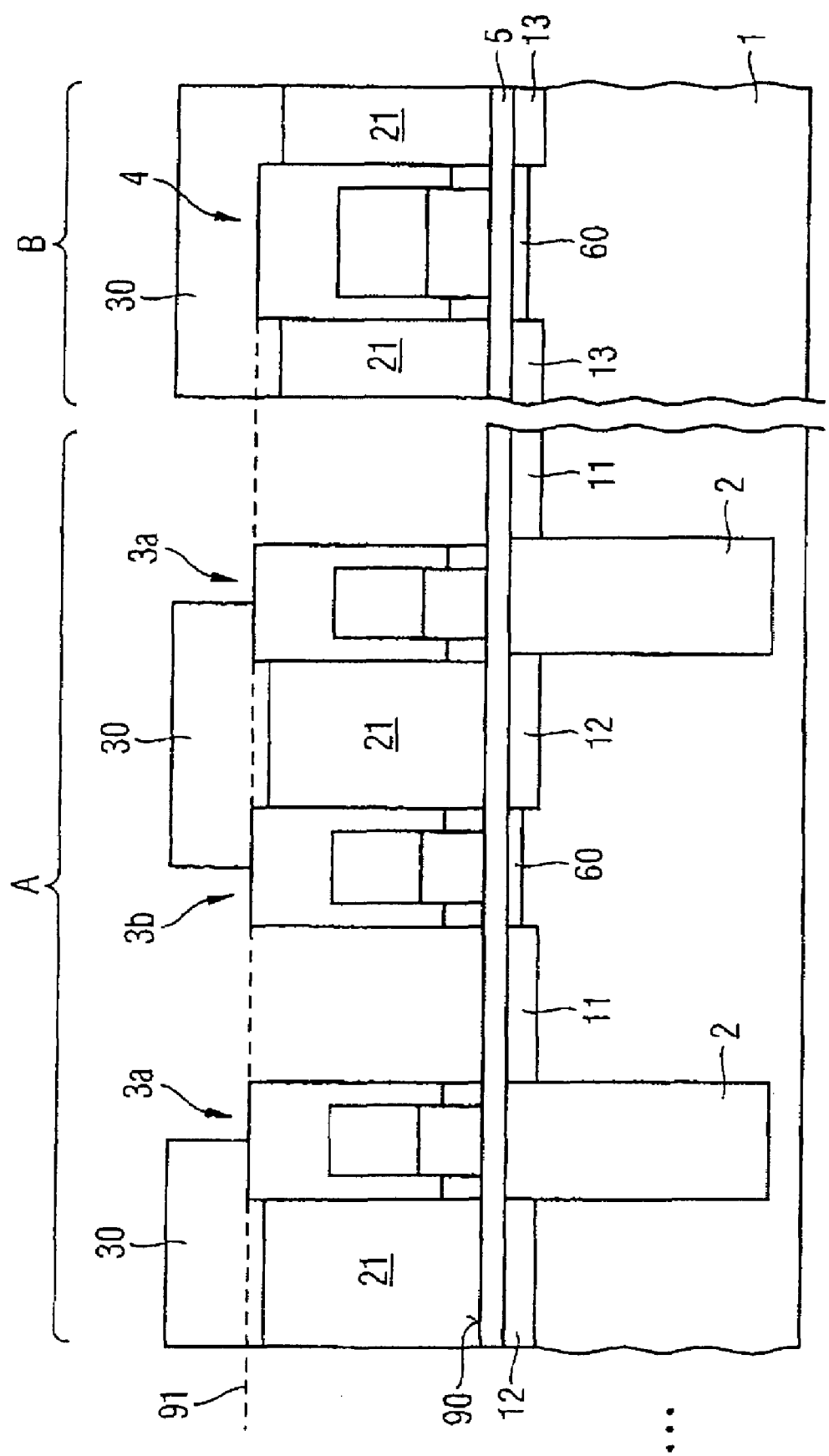

A particularly preferred configuration of the process according to the invention is described with reference to FIG. 2a to 2g. FIG. 2a diagrammatically depicts a part-section through a typical memory cell arrangement. The semiconductor component has a first portion A and a second portion B, for example a memory cell region A with a multiplicity of memory cells and a logic region B with a driving circuit.

The text which follows describes, by way of example, the second configuration for the memory cell region A having at least one memory cell. The memory cell has a storage capacitor 2 (capacitor) and a horizontal transistor. The transistor has a channel region 60 near to a horizontal surface 90 of the semiconductor substrate 1. A node region 11 (first region) and a bit line region 12 (second region) are arranged opposite one another, horizontally adjacent to the channel region 60. A gate stack 3b, which is insulated from the semiconductor substrate 1 by a dielectric layer 15, is provided on the horizontal surface 90, vertically with respect to the channel region 60. When a suitable potential is applied to the gate stack 803, the bit line region 812 is conductively connected to the node region 811.

The capacitor 2 and the transistor are arranged in such a way that the capacitor is conductively connected to the node region 11. Therefore, when the transistor is switched to a conducting state, a current path is produced between the storage capacitor 2 and the bit line region 12. The bit line region 12 is preferably connected to a bit line of the memory device.

The gate stack 3b includes a polysilicon region 7, a metallization 6 and a nitride cap 5. Control signals are preferably fed in via the metallization 6, which is connected for example to a word line. The corresponding signals switch the channel region 60 to a conducting or blocking state. In addition, a gate stack typically has spacers 8 which are arranged laterally on the gate stack 3b.

Second gate stacks 3a serve as a gate supply conductor for gate stacks arranged offset.

The logic region B is only highly diagrammatically depicted and has one or more transistors, the gate stacks 4 of which may substantially correspond to the gate stacks 3a, 3b of the memory cell region A.

The present configuration provides the semiconductor substrate 1 with a different doping profile in the first region 11 than in the second region 12. The text which follows provides the individual steps of the particularly preferred configuration required to achieve the abovementioned object.

In one step, a first capping layer 21 is applied above the first regions 11 and the second regions 12. Therefore, the first regions 11 and the second regions 12 are covered. The spaces between the gate stacks 3a, 3b above the first and second regions 11, 12 are advantageously completely filled, in such a manner as to produce a planar level 91 which ends flush with the nitride caps 5 of the gate stacks 3a, 3b. However, this is not imperative, but rather it is also possible for the second capping layer 21 to be slightly recessed (cf. FIG. 2) or to project slightly.

It is also illustrated that the first capping layer 21 is likewise applied to third regions 13 in the logic region B around a gate stack 4 of the logic region B. These logic regions B, which are not separated from the memory cell regions A, can be covered by means of capping layers 21 in such a manner that subsequent production steps (not described here) for fabricating the semiconductor component cannot destroy a functional structure in the logic region B.

Chemical mechanical polishing of the level 91 is advantageously although likewise not necessarily carried out, in order to provide a planar surface and to deliberately draw the capping layer 21 back below the level 91.

In a subsequent step, a photoresist is applied to the level 91. The wafer with the semiconductor components is accurately aligned with respect to an exposure device and then exposed, and the exposed or unexposed regions, depending on the photoresist used, are removed by a subsequent etching or incineration process. The result is the part-section illustrated in FIG. 2c. The arrangement of the photolithographic mask 30 is such that the second regions 12 are completely covered and the first regions 11 are not covered. The capping layer 21 is removed from the first regions 11 by an etching process. This uncovers the first surface 90 of the semiconductor substrate 1 in the first regions 11. In addition, the mask 30 can also be applied in the logic portion B.

Figure 2D:
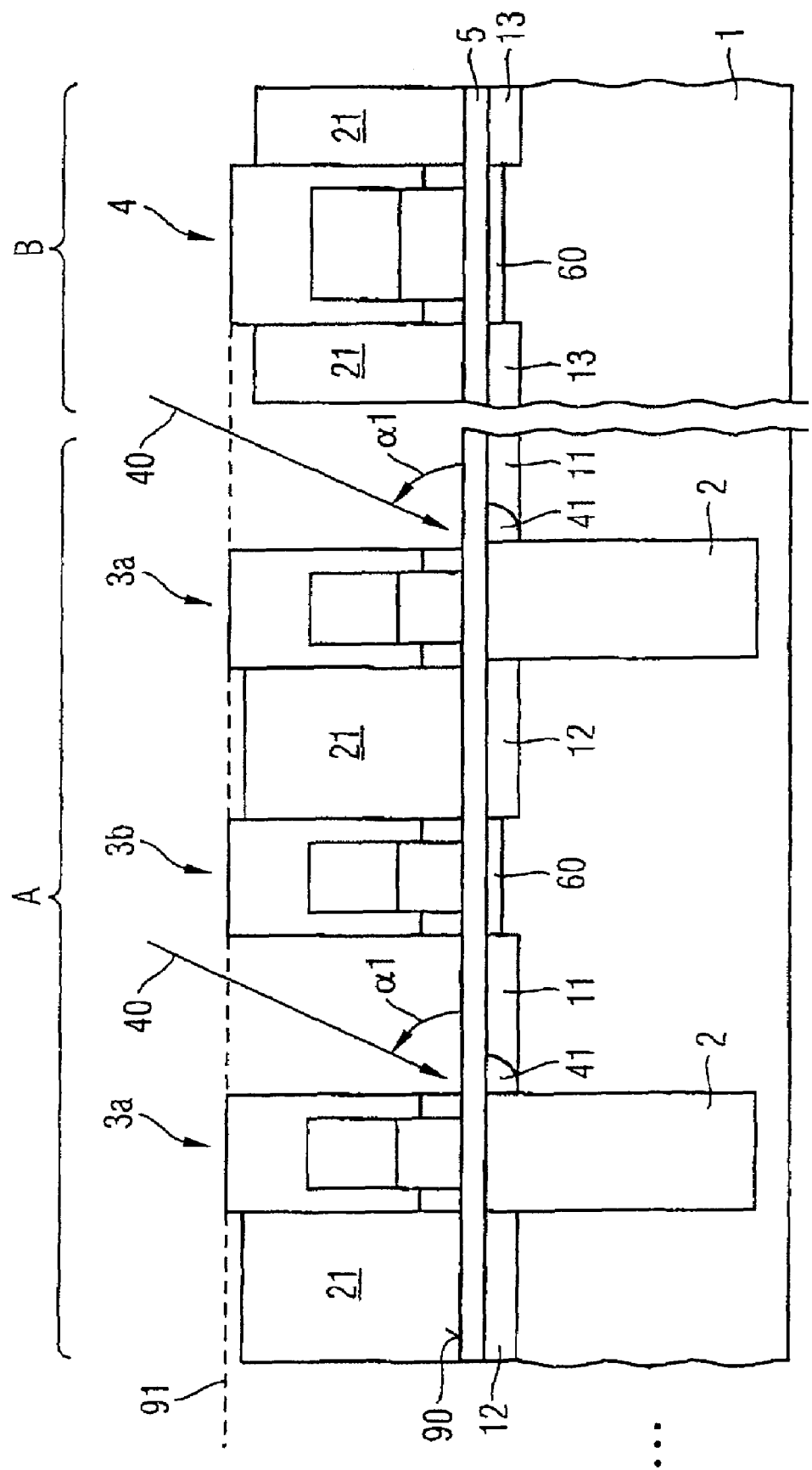
Figure 2E:
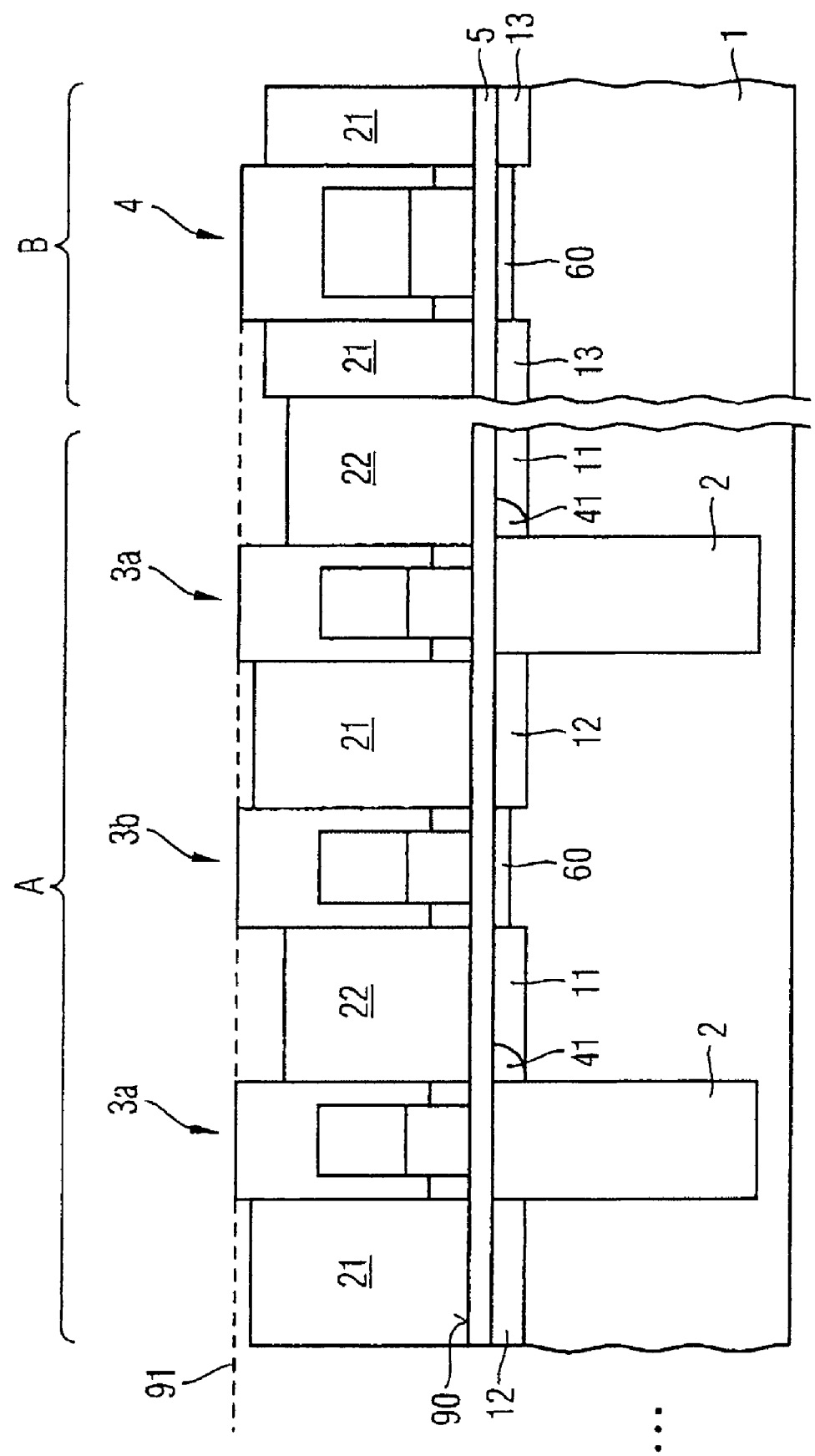

The semiconductor substrate 1 can then be doped in the uncovered first regions 11 of the memory cell region A. By way of example, an ion implantation step 40 is symbolically indicated by the arrow. One significant step in the production of the memory cells illustrated is that of adapting the resistance between the capacitor 2 and the bit line region 12 (second region) in the desired way, as has already been explained. These resistances can be deliberately altered at a later stage by doping 41 in the vicinity of the capacitor 2. In this case, it is necessary for the doping 41 to be carried out in the vicinity of the capacitor 2 in order not to affect the switching properties of the vertical switching transistor having the second gate stack 3b. Therefore, the dopants are implanted into the semiconductor substrate 1 at an angle α1 to the first surface 90 of the semiconductor substrate 1, in order to obtain a doping profile (FIG. 2d).

If, on account of process fluctuations, the transistor is arranged with a different offset with respect to the capacitors, a different resistance in a connecting path between the capacitor and the transistor results. This resistance can be deliberately increased or reduced by a correspondingly lower or higher dopant concentration in the semiconductor substrate, in order to set a predetermined and/or identical resistance within the semiconductor component.

Then, in a subsequent step, the first region 111 is covered by a second capping layer 22. In this context, it is once again advantageous for the second capping layer 22 to form a common planar level 91 with the nitride caps 5. However, this is not imperative, but rather it is also possible for it to be slightly recessed (FIG. 2e) or slightly projecting.

The photolithographic mask 30 is advantageously removed prior to the implantation of the dopants 41 into the semiconductor substrate 1. This can be done in a conventional way by selective etching or incineration in an oxygen-containing atmosphere.

Figure 2F:
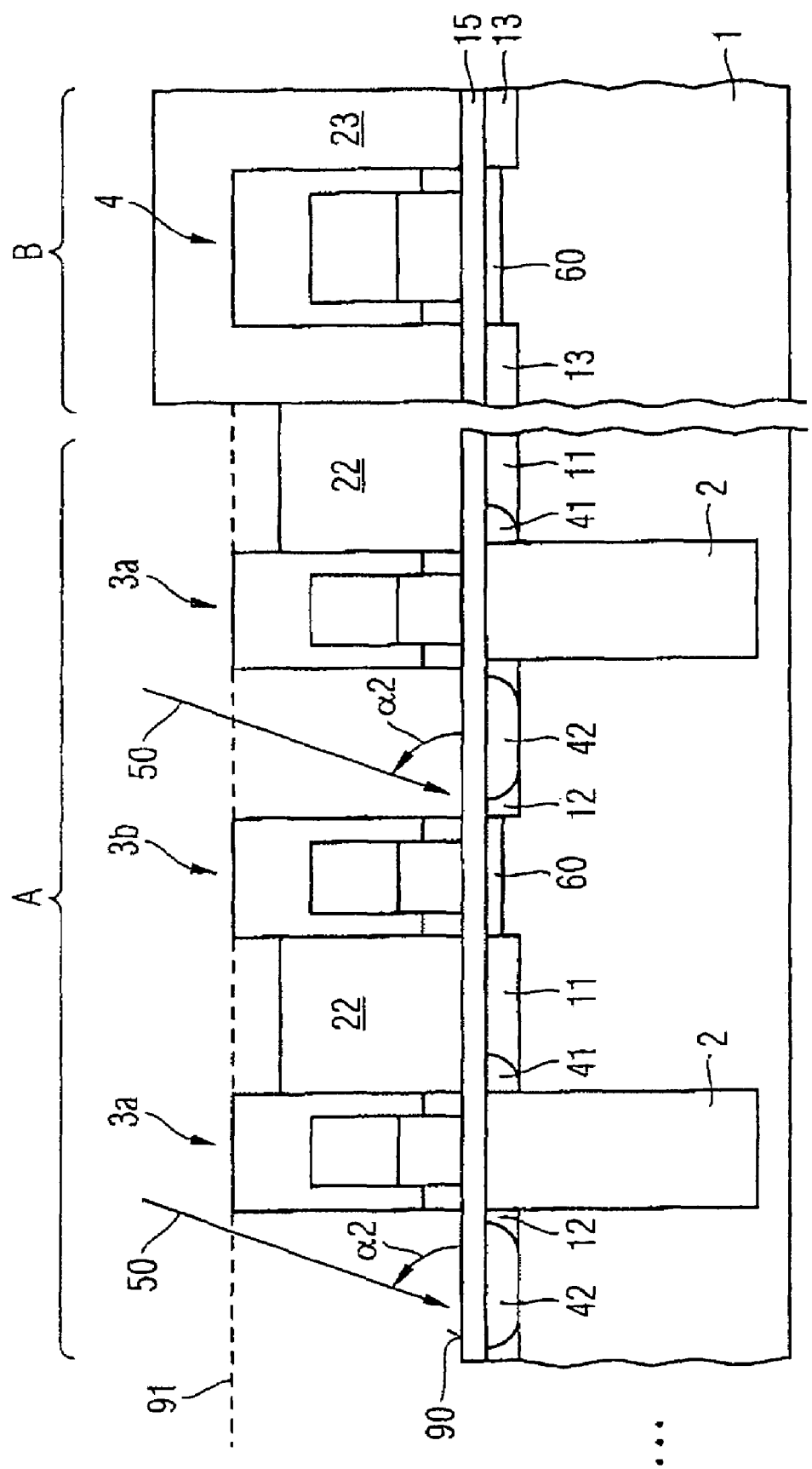
Figure 3:
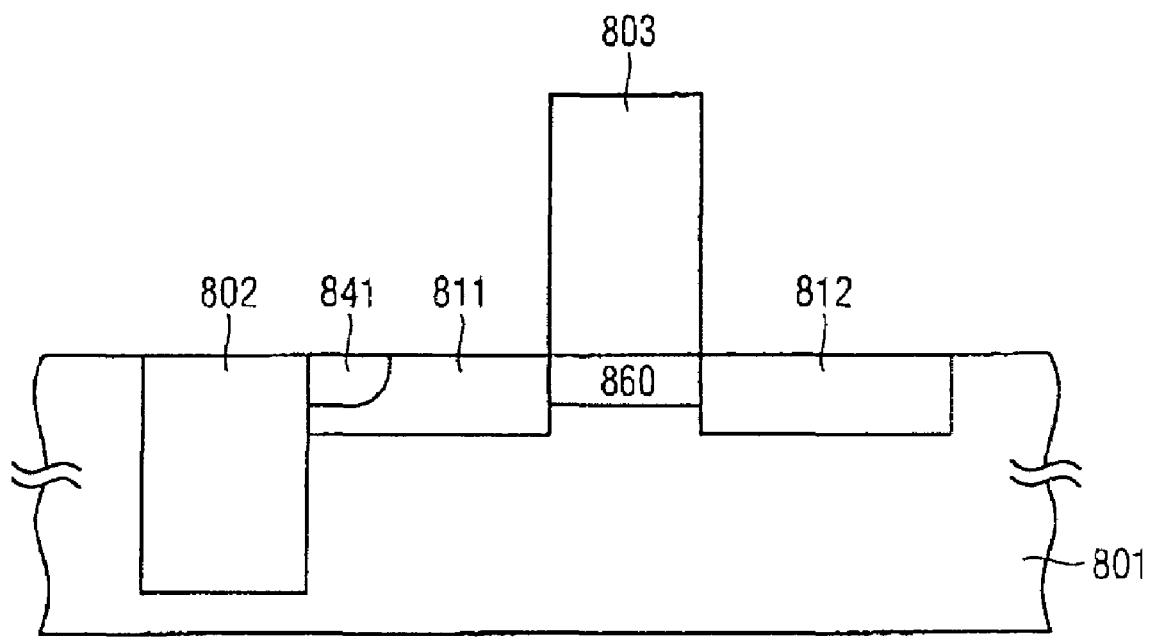
FIG. 3, as discussed above, is a part-section through a known memory cell.

In a subsequent step, the first capping layer 21 is selectively etched out of the second regions 12. In this step, the second capping layer 22 is only slightly etched (FIG. 2f). Then, the second regions 12 of the semiconductor substrate 1 are uncovered and can be altered by subsequent patterning processes. Prior to these patterning processes, it is advisable, if this have not already taken place, to apply a protective mask 23 in the logic region B.

As indicated by the arrows 50, dopants 42 can once again be implanted into the semiconductor substrate 1 at an angle α2. The implantation angle α2 may differ from the first implantation angle α1. The first implantation angle α1 generally only has an angle of less than 90°, so that the doping 41 takes place only in the vicinity of the capacitor 2. The second implantation angle α2 has angles of less than, equal to or greater than 90° and can also be altered during the implantation. In this way, what are known as halo structures are introduced into the semiconductor substrate 1. The number of individual implantation steps, both with regard to the first implantation step in the first regions and the second implantation step in the second regions 12, is not restricted by the configuration described above. The number of individual steps, their duration, the dopants used, etc. depend on the desired doping profile 41, 42 in the first and second regions 11, 12.

Following the process steps described above, it is optionally possible for a spacer to be deposited on the second region 12. In subsequent steps, a plurality of further layers for the patterning of other regions, e.g. the logic region B, are temporarily applied. The spacer in this case serves as a way of subsequently deliberately uncovering the second region 12 again. In this context, inter alia processes using selective etching steps are employed. For this purpose, by way of example, selective etching can be carried out in a first step, in such a manner that the spacer is not removed but other materials are, and/or in a second step the spacer is selectively etched. This uncovers the second region 12, whereas the first region 11, following the etching process described, remains covered by the second capping layer 22. There is advantageously no need for accurate alignment of the wafer and application of a critical mask in order to select the second region 12.

In subsequent steps, the second capping layer 22 can be removed from the first regions if desired. The protective mask 23 can now also be removed in the logic region B.

Although the present invention has been described on the basis of two preferred configurations, it is not restricted to these configurations.

In particular, the materials used for the first and second capping layers can be selected as desired. The only criterion for the selection of these materials is that the first material can be removed selectively with respect to the second material by an etching process. This is preferably done by an etching process. In this case, there are numerous known combinations of the materials in the prior art which have this property. It is particularly preferable to use combination such as polysilicon and polysilicon-germanium for the first capping layer and silicon oxide and silicate glasses, which are applied for example by a TEOS process, as second materials.

I claim as my invention:

1. A method for patterning a semiconductor component, comprising the steps of:
   providing at least one gate stack on a semiconductor component;
   applying a first cover layer to a first region and a second region of the semiconductor component being arranged in a semiconductor substrate;
   said first region being adjacent to one side of said gate stack and said second region being adjacent to an opposite side of said gate stack;
   patterning said first cover layer using a photolithographic mask so that said first region is uncovered and said second region remains covered by said first cover layer;
   implanting a dopant material at a first angle into the semiconductor component in said uncovered first region;
   applying a second cover layer to said uncovered first region;
   removing said first cover layer by means of a selective etching process so that said second region is uncovered; and
   implanting a dopant material at a second angle into the semiconductor component in said uncovered second region, the first angle and the second angle being different.

2. The method of claim 1, comprising removing said first cover layer by a selective etching.

3. The method of claim 1, comprising removing said photolithographic mask at the earliest after removing said first cover layer from said first region and before removing selectively said first cover layer from said second region.

4. The method of claim 1, comprising, following the step of applying said second cover layer, uncovering said first cover layer by planarizing and receding said second cover layer.

5. The method of claim 1, wherein at least one of said first cover layer or said second cover layer comprises at least one of polysilicon, polysilicon-germanium, silicon oxide, aluminum oxide, and silicate glass.

6. The method of claim 1, comprising doping at least one of said first region and second region by means of ion implantation.

7. The method of claim 1, comprising doping said first region by means of ion implementation at a first implantation angle with respect to a surface of said semiconductor substrate and doping said second region by means of ion implementation at a second implantation angle with respect to said surface of said semiconductor substrate; said first implementation angle being different to said second implementation angle.

8. The method of claim 7, comprising doping said second region by means of multiple ion implantation at different second implantation angles.

9. The method of claim 1, comprising arranging at least one vertical gate stack on said semiconductor component; said first region and said second region being horizontally adjacent to two opposite sides of said vertical gate stack.

10. The method of claim 1, comprising applying a spacer to said uncovered second region and to said second cover layer in said first region.

* * * * *